United States Patent
Baba et al.

(10) Patent No.: US 7,277,017 B2
(45) Date of Patent: Oct. 2, 2007

(54) RFID TAG

(75) Inventors: Shunji Baba, Kawasaki (JP); Toru Maniwa, Kawasaki (JP); Takashi Yamagajo, Kawasaki (JP); Manabu Kai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 217 days.

(21) Appl. No.: 11/232,035

(22) Filed: Sep. 22, 2005

(65) Prior Publication Data
US 2006/0220871 A1    Oct. 5, 2006

(30) Foreign Application Priority Data
Apr. 5, 2005    (JP) .............................. 2005-108675

(51) Int. Cl.
*G08B 13/14*    (2006.01)

(52) U.S. Cl. .............................. 340/572.7; 340/572.1; 340/572.8; 235/492

(58) Field of Classification Search ............. 340/572.1, 340/572.7, 572.8; 235/492
See application file for complete search history.

(56) References Cited

U.S. PATENT DOCUMENTS

| | | | |
|---|---|---|---|
| 6,404,643 B1 * | 6/2002 | Chung | 361/737 |
| 6,421,013 B1 * | 7/2002 | Chung | 235/441 |
| 6,888,509 B2 * | 5/2005 | Atherton | 340/572.7 |
| 2003/0075608 A1 | 4/2003 | Atherton | |

FOREIGN PATENT DOCUMENTS

| | | |
|---|---|---|
| JP | 2003-524811 | 8/2003 |
| WO | WO 00/22893 | 4/2000 |

* cited by examiner

*Primary Examiner*—Jeffery Hofsass
*Assistant Examiner*—Samuel J. Walk
(74) *Attorney, Agent, or Firm*—Staas & Halsey, LLP (57) ABSTRACT

The present invention relates to an RFID tag and is provided with a function of detecting peeling while maintaining a good antenna characteristic. A first conductive pattern includes two extending sections extending from an IC chip, each end of which is connected to the IC chip, and a correction pattern for antenna characteristic correction which bypasses the IC chip and connects the two extending sections, and a peeling detection pattern is formed in an area enclosed by the two extending sections and the correction pattern.

5 Claims, 9 Drawing Sheets

RFID TAG

BACKGROUND OF THE INVENTION

1. Field of the Invention

The present invention relates to an RFID tag (Radio_Frequency_IDentification) tag which exchanges information with an external device in a non-contact manner. Note that among those skilled in the technical field of the present application, the "RFID tag" used in the present specification is regarded as an internal component (inlay) for the "RFID tag" and so it may be referred to as an "inlay for radio IC tag". Or this "RFID tag" may be referred to as a "radio IC tag". Furthermore, this "RFID tag" also includes a non-contact type IC card.

2. Description of the Related Art

Various types of RFID tags that exchange information with an external device represented by a reader/writer by radio in a non-contact manner are proposed in recent years. As a kind of this RFID tag, there is a proposal of an RFID tag having such a structure that a radio wave communication antenna pattern and IC chip are mounted on a base sheet made of plastics or paper and such a type of RFID tag is designed to be used in a mode in which the RFID tag is pasted to an article and information on the article is exchanged with an external device to thereby identify the article.

Figure 1:
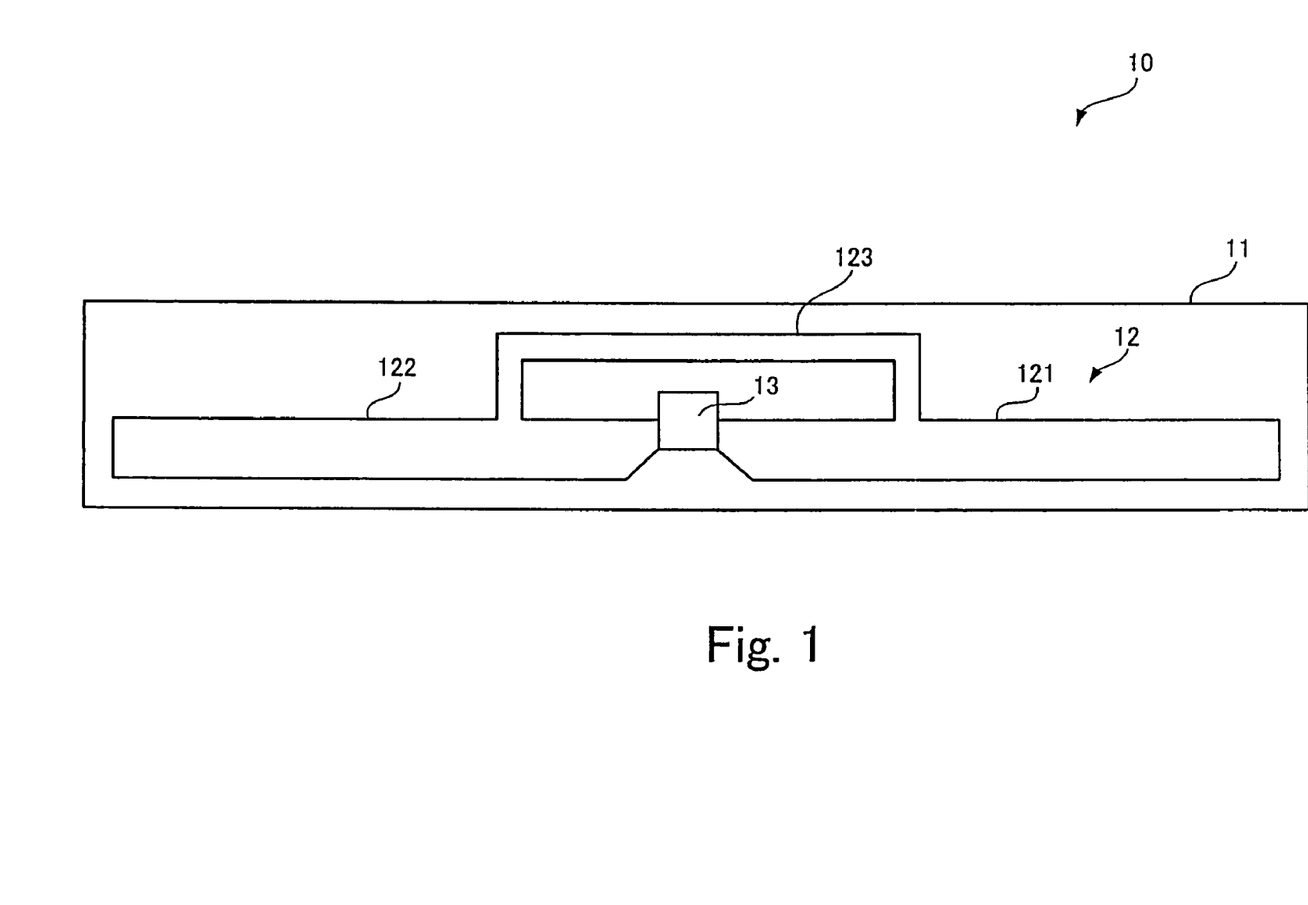
FIG. 1 is a plan view showing an example of an RFID tag.

FIG. 1 is a plan view showing an example of an RFID tag. The figure illustrates a state in which a cover sheet, etc., is removed.

In this RFID tag 10, an antenna pattern 12 is formed on a base sheet 11 and an IC chip 13 is placed on this antenna pattern 12. This antenna pattern 12 is a conductive pattern which operates as a dipole antenna consisting of two mono pole patterns 121, 122 extending sideward from the IC chip 13, ends on the IC chip 13 side of which are electrically connected to the IC chip 13. Furthermore, this antenna pattern 12 is provided with a correction pattern 123 for correction of an antenna characteristic, which bypasses the IC chip 13 and connects two extending sections (which correspond to the two mono pole patterns 121, 122 in the structure shown in this FIG. 1), one end of which is connected to the IC chip 13, of this antenna pattern 12. A circuit for carrying out a radio communication with an external device using the antenna pattern 12 as an antenna is built in this IC chip 13.

Figure 2:
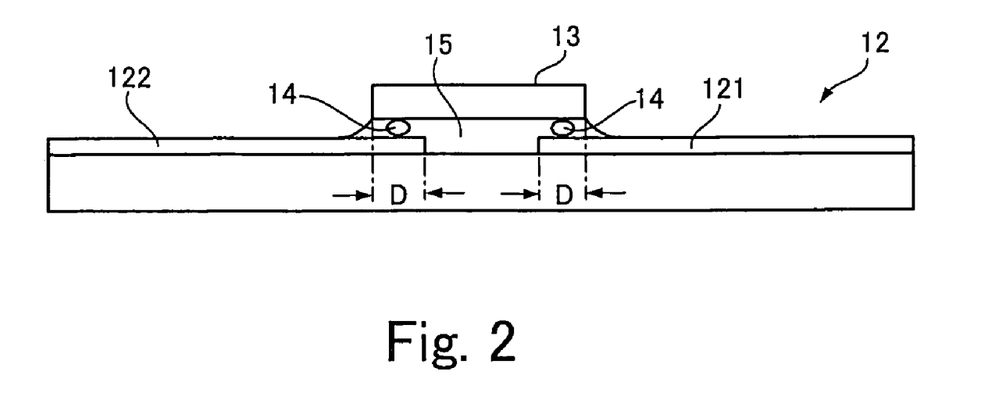
FIG. 2 illustrates a connection structure between an IC chip and an antenna pattern.

FIG. 2 shows a connection structure between the IC chip 13 and antenna pattern 12.

The IC chip 13 and antenna pattern 12 are connected by means of flip chip through bumps 14 and surroundings of the bumps 14 are fixed by an adhesive 15.

Here, when the IC chip 13 and antenna pattern 12 are connected by means of flip chip, the ends of the antenna pattern 12 and the IC chip 13 vertically overlap with each other in areas D shown in FIG. 2, which produces a parasitic capacitance C in those parts. When no measures are taken, this parasitic capacitance C causes an adverse influence on the antenna characteristic (radio communication characteristic). The correction pattern 123 shown in FIG. 1 operates as an inductor L which cancels out the influence of this parasitic capacitance C.

The RFID tag 10 has the basic structure shown in FIG. 1, FIG. 2 and the antenna pattern 12 and circuit chip 13 are further covered with a cover sheet.

In a mode of use of such an RFID tag, there is a possibility of tampering that the RFID tag pasted to an article may be peeled off the article and repasted to another article so as to cause an external device to misidentify the article and purchase an expensive article as a cheap one and there is a demand for a technique of avoiding such tampering.

In view of such a current situation, a technique of destroying the antenna pattern, the RFID tag of which is peeled, to disable communications is proposed (e.g., see US Patent Laid-Open No. 2003/075608, U.S. Pat. No. 6,421,013 and National Publication of International Patent Application No. 2003-524811).

Figure 3:
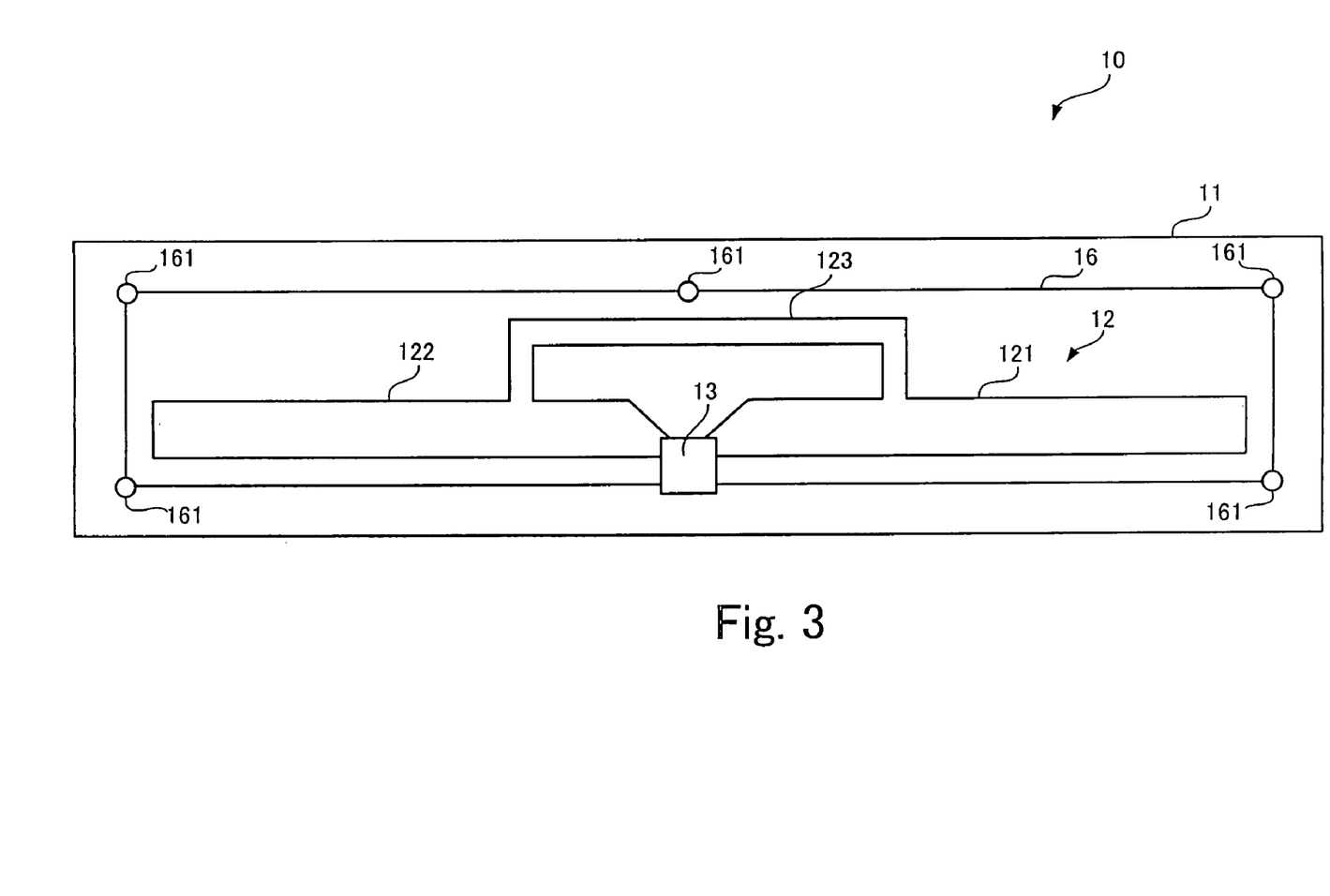
FIG. 3 is a plan view showing an example of an RFID tag having the basic structure explained with reference to FIG. 1, FIG. 2 and with a peeling detection function added.

FIG. 3 is a plan view showing an example of an RFID tag having the basic structure which has been explained with reference to FIG. 1, FIG. 2 and with a peeling detection function added. A cover such as a cover sheet is removed in this FIG. 3, too.

In the RFID tag 10 shown in this FIG. 3, as in the case of FIG. 1, an antenna pattern 12 made up of mono pole patterns 121, 122 as a dipole antenna is formed on a base sheet 11 and an IC chip 13 is connected to ends of the two mono pole patterns 121, 122 by means of flip chip. Furthermore, this antenna pattern 12 includes a correction pattern 123 which bypasses the IC chip 13 and connects the mono pole patterns 121, 122.

The descriptions so far are similar to those of the RFID tag shown in FIG. 1, but in the case of the RFID tag shown in FIG. 3, a loop peeling detection pattern 16 is additionally formed on the base sheet 11 in such a way as to surround the antenna pattern 12. Both ends of the loop of this peeling detection pattern 16 are also connected to the IC chip 13 by means of flip chip in a structure similar to the connection structure (see FIG. 2) between the antenna pattern 12 and IC chip 13 and this IC chip 13 includes not only the function of radio communication with an external device using the antenna pattern 12 but also the function of detecting destruction of the peeling detection pattern 16. Here, the peeling detection pattern 16 is made of a material such as silver paste, which is conductive, relatively brittle and destructible. This peeling detection pattern 16 is provided with peeling detection points 161 at several locations on the loop.

In the case of the RFID tag shown in FIG. 3, in addition to the antenna pattern 12 and IC chip 13, the peeling detection pattern 16 is further covered with a cover sheet. The peeling detection points 161 of the peeling detection pattern 16 are strongly bonded to the cover sheet, while parts other than the peeling detection points 161 of the peeling detection pattern 16 are bonded more strongly to the base sheet 11 than to the cover sheet. For this reason, when an attempt is made to peel off the cover sheet, the cover sheet is peeled off with only the peeling detection points 161 of the peeling detection pattern 16 remaining bonded to the cover sheet, the peeling detection pattern 16 is destroyed and the IC chip 13 detects the destruction of the peeling detection pattern 16. This prevents the tampering of this RFID tag 10.

However, in the case of the structure shown in FIG. 3, the peeling detection pattern 16 surrounds the antenna pattern 12 and this peeling detection pattern is also made of a conductor, which produces an adverse effect on the antenna characteristic of the antenna pattern 12, greatly attenuates radio waves emitted from the antenna pattern 12 compared to a case in which the peeling detection pattern 16 does not exist (see FIG. 1), causing a problem that the outreach of radio waves (distance within which a radio communication is possible) is drastically shortened.

SUMMARY OF THE INVENTION

The present invention has been made in view of the above circumstances and provides an RFID tag having a function of detecting peeling while maintaining good antenna characteristics.

The RFID tag according to the present invention is provided with;

a base;

a first conductive pattern provided on the base, which operates as a communication antenna; a second conductive pattern for peeling detection provided on the base, which is destroyed when peeled off the base;

a circuit chip electrically connected to both the first conductive pattern and the second conductive pattern, which carries out a radio communication using the first conductive pattern as an antenna and detects the destruction of the second conductive pattern; and a cover covering the first conductive pattern, the second conductive pattern and the circuit chip, which is bonded to the base in a detachable manner and peeled off the base with the whole or part of the second conductive pattern remaining bonded, wherein the first conductive pattern includes two extending sections extending from the circuit chip, each end of which is connected to the circuit chip and a correction pattern for antenna characteristic correction which bypasses the circuit chip and connects the two extending sections, and the second conductive pattern is formed within an area enclosed by the two extending sections and the correction pattern.

Since the second conductive pattern for peeling detection is formed within an area enclosed by the two extending sections and the correction pattern, the RFID tag of the present invention produces substantially no influence on the antenna characteristic, maintains a good antenna characteristic and can also detect peeling.

Here, the correction pattern in the RFID tag of the present invention is an inductor which typically cancels out a parasitic capacitance produced between the circuit chip and the ends of the first conductive pattern connected to the circuit chip.

Furthermore, the first conductive pattern of the RFID tag of the present invention may include a pattern of a loop antenna, both ends of which are connected to the circuit chip or the first conductive pattern may include a pattern of a dipole antenna made up of two mono pole patterns, one end of which is connected to the circuit chip.

Furthermore, the second conductive pattern of the RFID tag of the present invention is preferably a loop pattern, both ends of which are connected to the circuit chip, provided with peeling detection points at several locations on the loop of the second conductive pattern, which are peeled while remaining bonded to the cover when the cover is peeled off the base.

In this way, providing peeling detection points at several locations improves reliability of peeling detection.

The present invention allows an RFID tag to be mounted with a peeling detection function while maintaining a good antenna characteristic.

DETAILED DESCRIPTION OF THE INVENTION

Embodiments of the present invention will be explained below.

Figure 4:
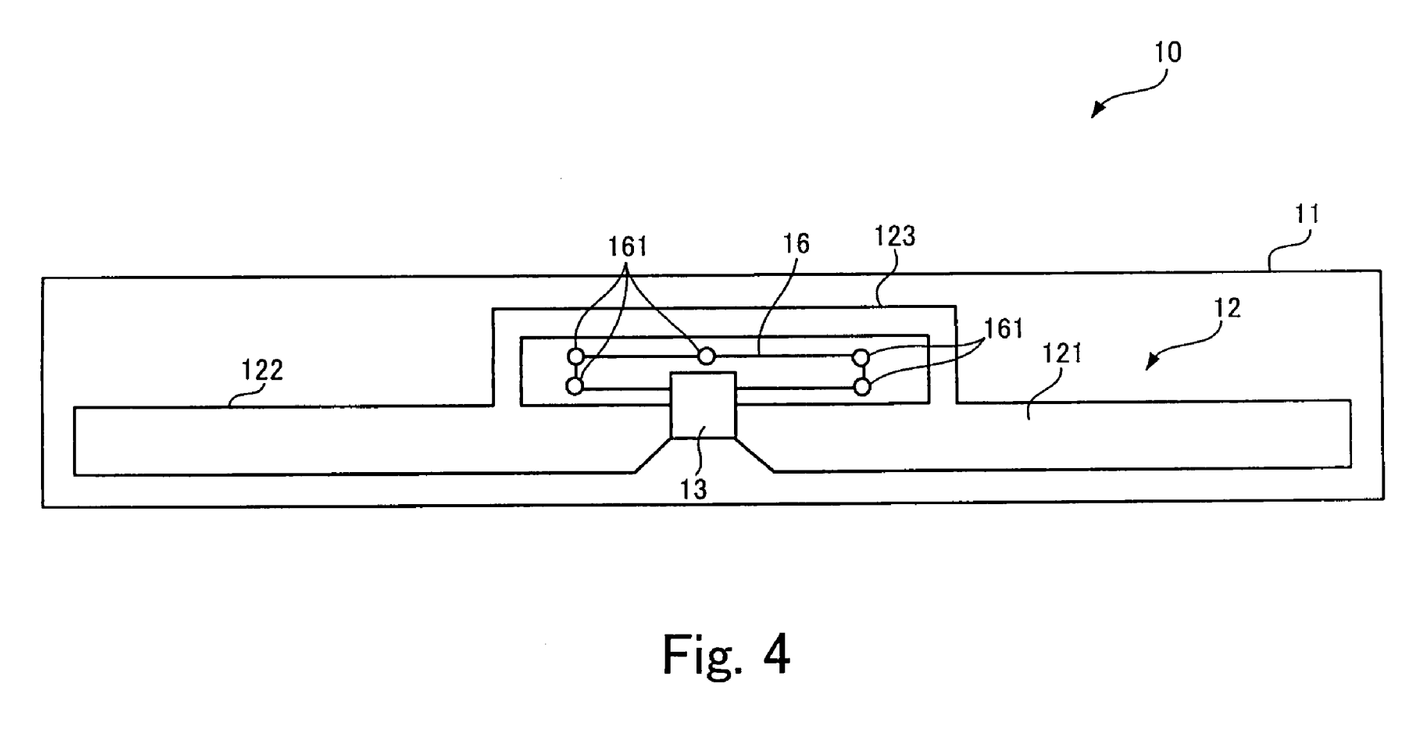
FIG. 4 is a plan view of an RFID tag as an embodiment of the present invention.

FIG. 4 is a plan view of an RFID tag as an embodiment of the present invention. Covers such as a cover sheet are removed in this FIG. 4, too.

The RFID tag 10 shown in this FIG. 4 includes an antenna pattern 12 as a dipole antenna made up of mono pole patterns 121, 122 formed on a base sheet 11 and an IC chip 13 connected by means of flip chip (see FIG. 2) at ends of the two mono pole patterns 121, 122. Furthermore, this antenna pattern 12 includes a correction pattern 123 which bypasses the IC chip 13 and connects the mono pole patterns 121, 122.

This correction pattern 123 is a pattern which operates as an inductor L to cancel out the parasitic capacitance C explained with reference to FIG. 2.

Furthermore, the RFID tag 10 shown in FIG. 4 includes a loop peeling detection pattern 16 made of a relatively brittle conductive material such as silver paste in an area enclosed by the two mono pole patterns 121, 122 and correction pattern 123 on the base sheet 11.

Both ends of the loop of this peeling detection pattern 16 is also connected to the IC chip 13 by means of flip chip having the same structure (see FIG. 2) as the connection structure with the antenna pattern 12 and this IC chip 13 includes not only a function of radio communication with an external device using the antenna pattern 12 but also a function of detecting the destruction of the peeling detection pattern 16. This peeling detection pattern 16 is provided with peeling detection points 161 at several locations on the loop.

In the case of the RFID tag shown in this FIG. 4, the antenna pattern 12, IC chip 13 and peeling detection pattern 16 are covered with a cover sheet. The peeling detection points 161 of the peeling detection pattern 16 are strongly bonded to the cover sheet, whereas parts other than the peeling detection points 161 of the peeling detection pattern 16 are bonded more strongly to the base sheet 11 than to the cover sheet. For this reason, when an attempt is made to peel off the cover sheet, the cover sheet is peeled off with only the peeling detection points 161 of the peeling detection pattern 16 remaining bonded to the cover sheet, the peeling detection pattern 16 is thereby destroyed and the IC chip 13 detects the destruction of the peeling detection pattern 16, thus preventing the tampering of this RFID tag 10.

The peeling detection pattern 16 shown in FIG. 4 is formed within the area enclosed by the conductive pattern made up of the two mono pole patterns 121, 122 and correction pattern 123, and therefore it is possible to have little effect on the antenna characteristic such as the outreach of a radio communication using the antenna pattern 12 and there is no need to increase outside dimensions for providing this peeling detection pattern 16, either.

Figure 5:
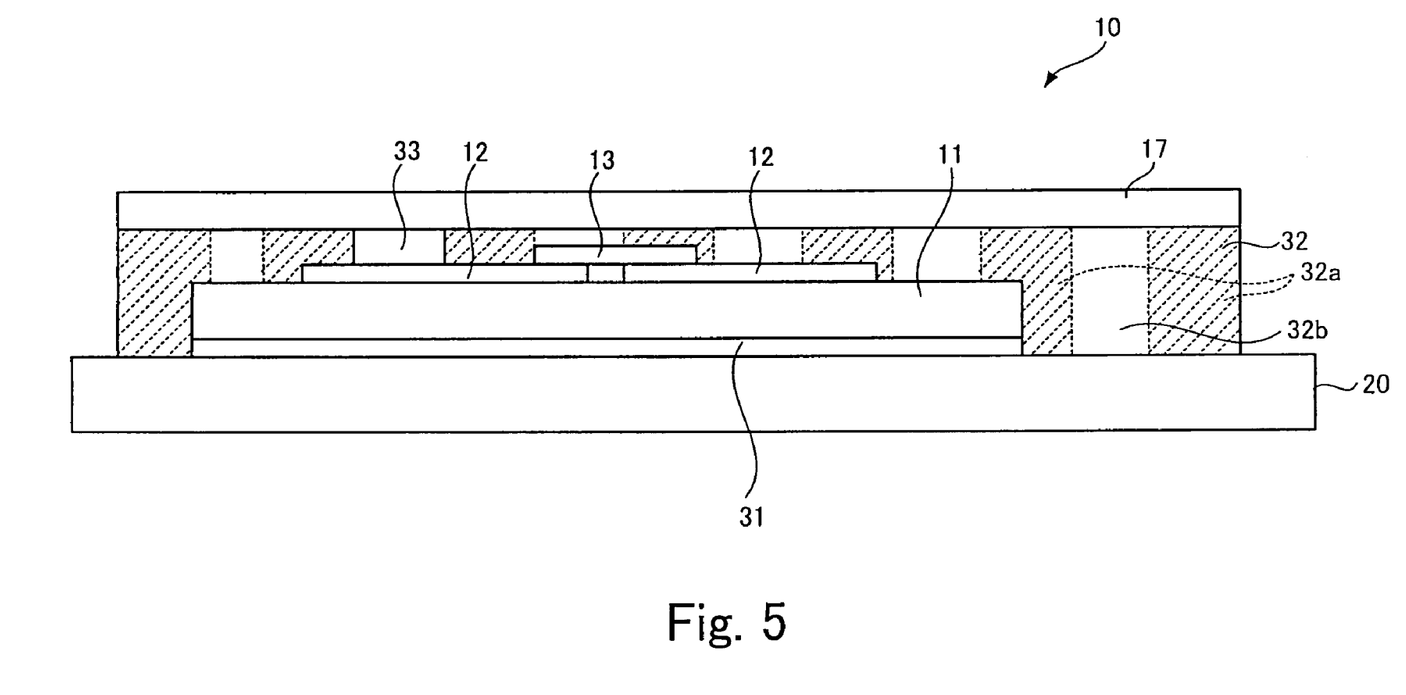
FIG. 5 is an enlarged view of a part of a peeling detection pattern of the RFID tag of this embodiment.
Figure 6:
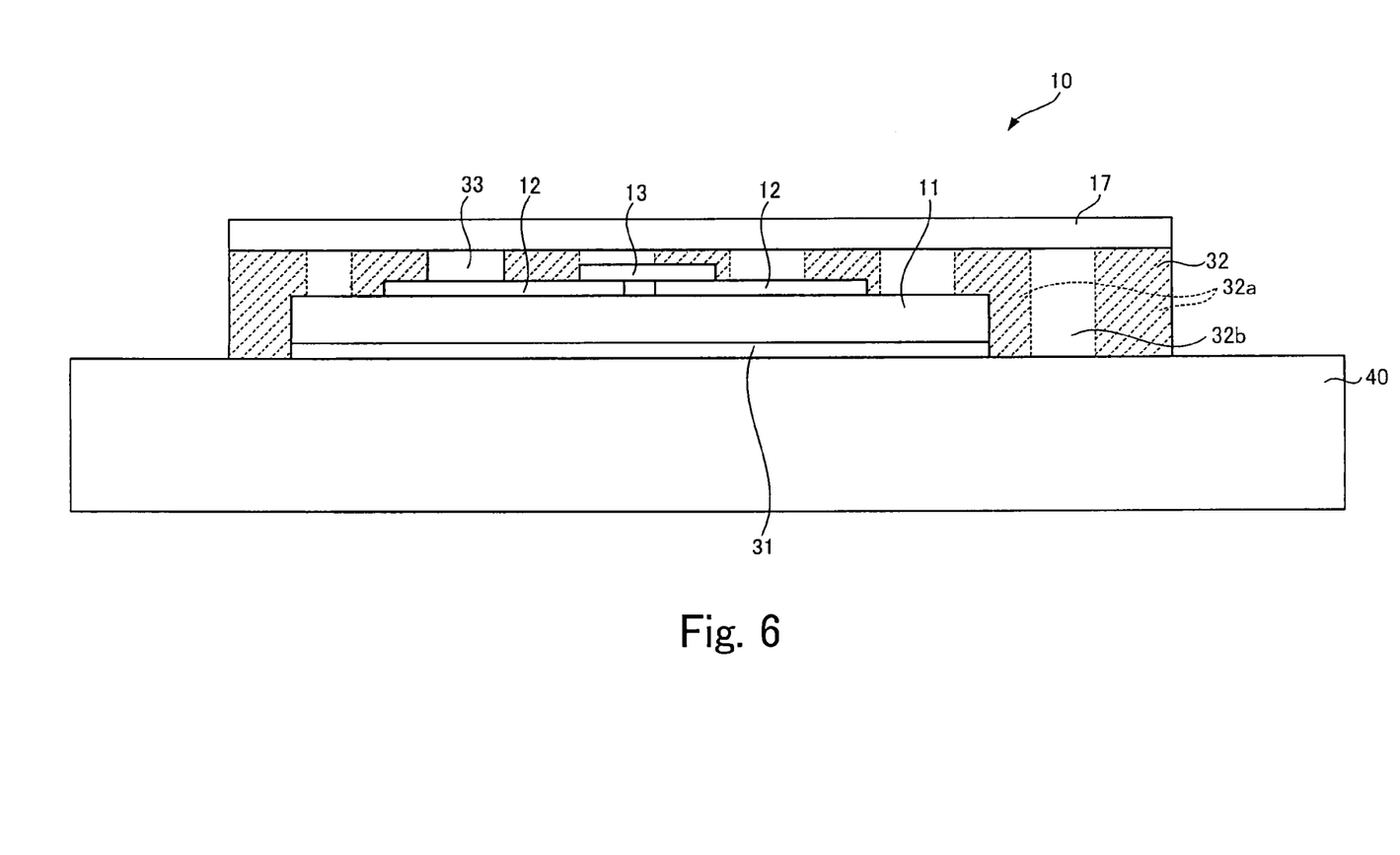
FIG. 6 is an enlarged view of a part of the peeling detection pattern of the RFID tag of this embodiment.
Figure 7:
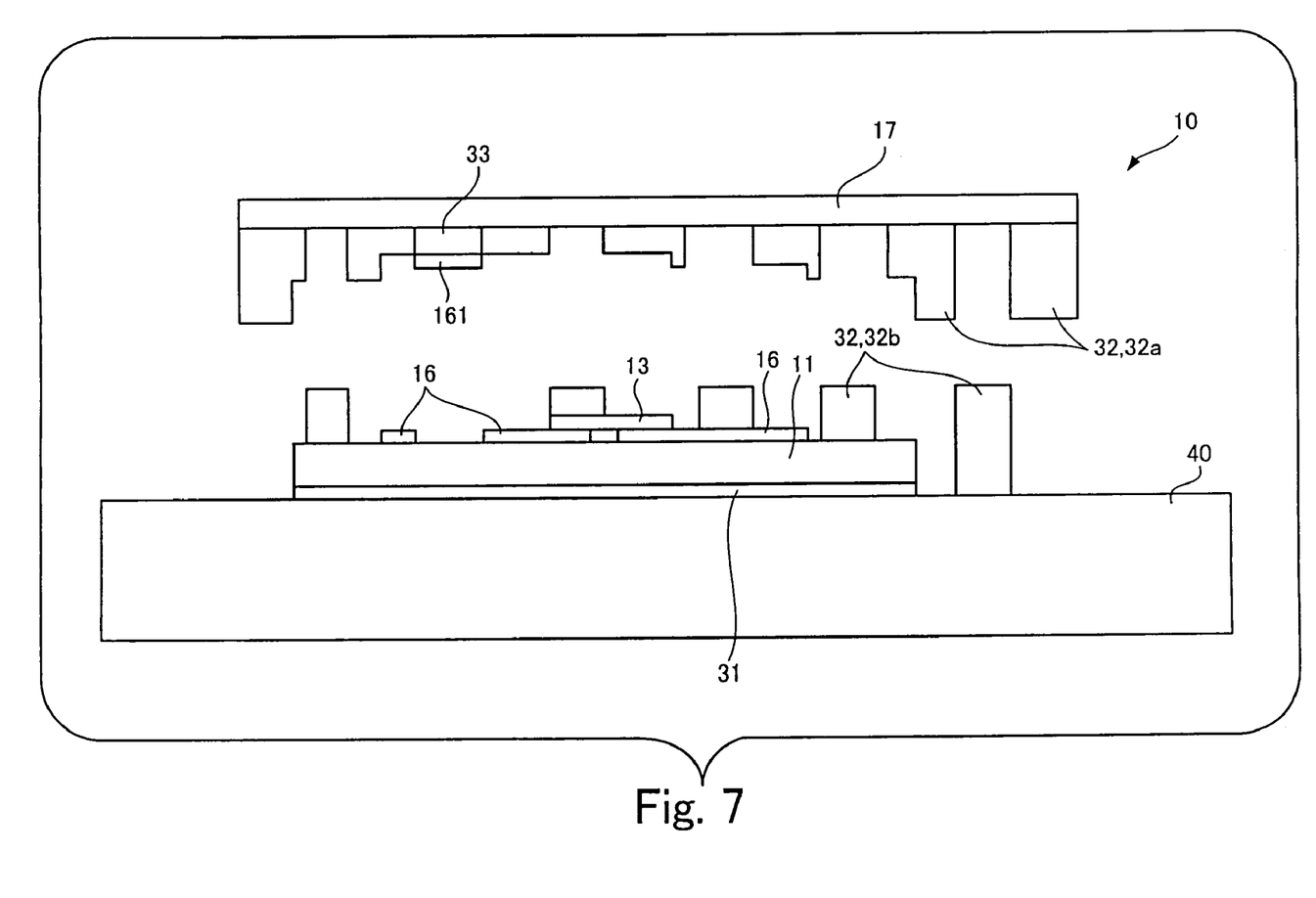
FIG. 7 is an enlarged view of a part of the peeling detection pattern of the RFID tag of this embodiment.

FIG. 5 to FIG. 7 are enlarged views of the parts of the peeling detection pattern of the RFID tag according to this embodiment. Here, FIG. 5 shows a state immediately after manufacturing, FIG. 6 shows a state in which the tag is pasted to an object and FIG. 7 shows a RFID tag peeled off the object.

The RFID tag 10 shown in FIG. 5 is the RFID tag 10 explained with reference to FIG. 4 which is constructed of the base sheet 11, the antenna pattern 12 formed on the base sheet 11, the peeling detection pattern 16 (not shown in FIG. 5 to FIG. 7), the IC chip 13 connected to the antenna pattern 12 and peeling detection pattern 16 by means of flip chip. In FIG. 5 to FIG. 7, the illustration of the connection structure between the peeling detection pattern 16 and IC chip 13 is omitted.

The base sheet 11 is bonded to a mount 20 through an adhesive 31 and the base sheet 11, antenna pattern 12, peeling detection pattern 16 (not shown) and IC chip 13 are covered with a cover layer 32 made of opaque ink and further covered with a cover sheet 17. The cover sheet 17 and cover layer 32 have a structure similar to a so-called counterfeit prevention label. The cover layer 32 is constructed in such a way as to be easily separable, when the cover sheet 17 is peeled off, into peeling sections 32a which are peeled together with the cover sheet 17 while remaining bonded to the cover sheet 17 and remaining sections 32b which separate from the cover sheet 17 remaining on the base sheet 11 or pasting target 40 (see FIG. 6) side.

Furthermore, an adhesive 33 having a strong adhesive force is also embedded in the part corresponding to the peeling detection points 161 of the peeling detection pattern 16 of the cover layer 32 and the peeling detection points 161 of the peeling detection pattern 16 is strongly bonded to the cover sheet 17 by this adhesive 33.

Here, the mount 20 shown in FIG. 5 is of a material having a low level of adhesion with the adhesive 31 and cover layer 32 on the back of the base sheet 11 and easily detachable and when this RFID tag is actually used, this RFID tag 10 is peeled off the mount 20 and actually used by being pasted to the pasting target 40 such as cardboard and plastics as shown in FIG. 6.

Once pasted to the pasting target 40 shown in this FIG. 6, the adhesive 31 on the back of the base sheet 11 and the remaining sections 32b of the cover layer 32 arranged in a mosaic shape have a predetermined adhesive force with respect to the pasting target 40, and after this RFID tag 10 is pasted to the pasting target 40, if the RFID tag 10 is peeled off the pasting target 40, the peeling sections 32a and the remaining sections 32b of the cover layer 32 are separated by a force much weaker than that of the adhesive 31 which pastes the base sheet 11 to the pasting target 40 as shown in FIG. 7. At this time, the peeling detection points 161 of the peeling detection pattern 16 is strongly bonded to the cover sheet 17 by the strong adhesive 33, and therefore the peeling detection points 161 are peeled from the peeling detection pattern 16 while remaining bonded to the cover sheet 17, which destroys the peeling detection pattern 16 and makes the peeling detection pattern 16 non-conducting and the IC chip 13 detects the fact that the peeling detection pattern 16 has become non-conducting and executes processing which has been incorporated beforehand against illegal peeling.

Furthermore, since the cover layer 32 is peeled in a patchy pattern, the peeling can be confirmed from appearances at first sight.

Figure 8:
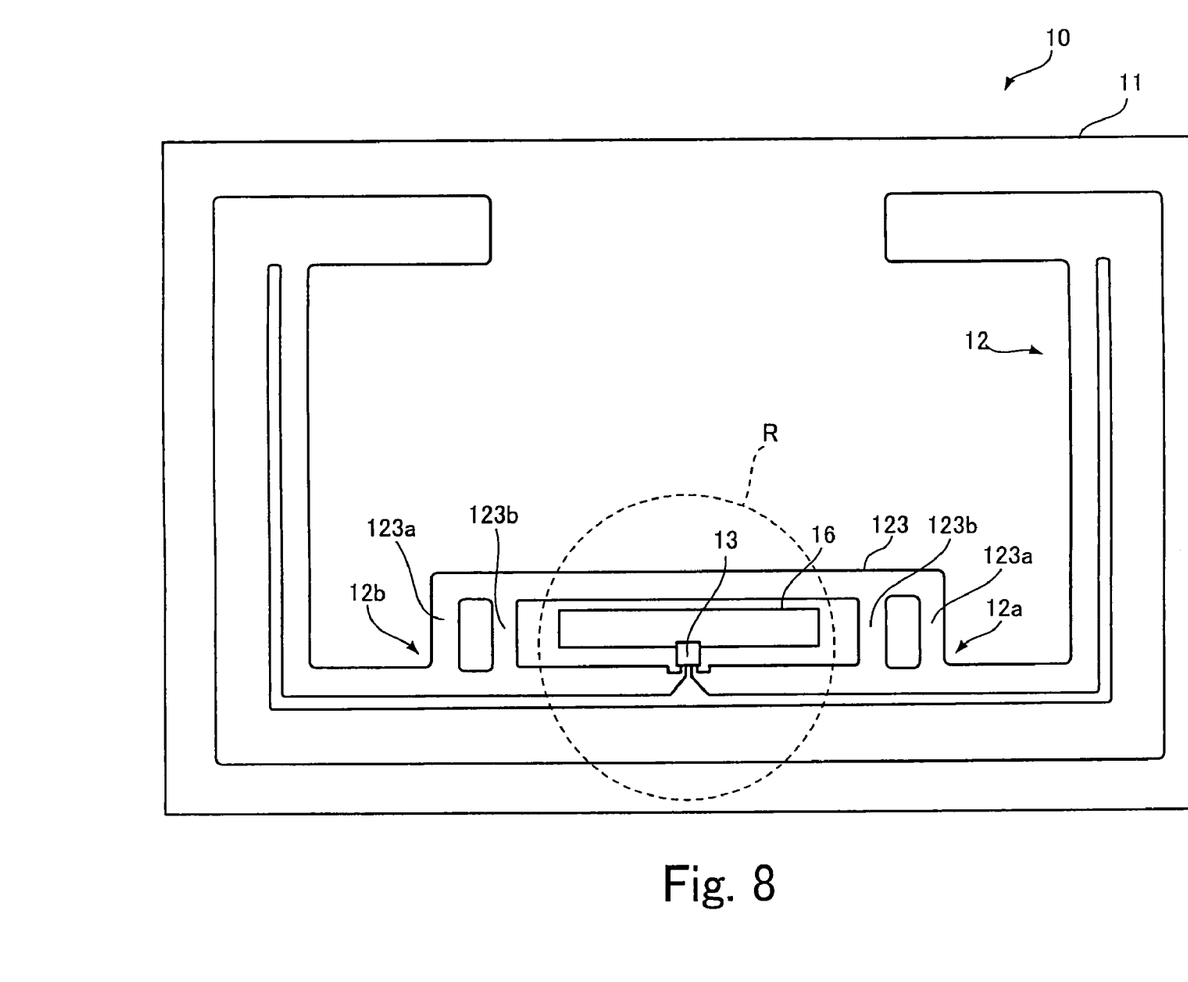
FIG. 8 is a plan view of an RFID tag according to a second embodiment of the present invention.

FIG. 8 is a plan view of an RFID tag according to a second embodiment of the present invention. The RFID tag is shown with the cover sheet, etc., removed here, too.

An antenna pattern 12 of the RFID tag 10 shown in this FIG. 8 is a conductive pattern of a loop antenna formed on a base sheet 11, both ends of which are connected to an IC chip 13 by means of flip chip (see FIG. 2). The antenna pattern 12 making up this loop antenna includes two extending sections 12a, 12b which extend from the IC chip 13, each end of which is connected to the IC chip 13, and a correction pattern 123 which bypasses the IC chip 13 and connects the two extending sections 12a, 12b. In the case of the embodiment shown in this FIG. 8, the correction pattern 123 includes double patterns of a pattern 123a and pattern 123b. This is because a parasitic capacitance C between the IC chip 13 and ends of the antenna pattern 12, which has been explained with reference to FIG. 2, fluctuates due to various error factors among many RFID tags being manufactured and the pattern 123a or pattern 123b is removed for each RFID tag and in this way an inductor L of the correction pattern 123 is adjusted according to the parasitic capacitance C of the RFID tag.

Furthermore, a loop peeling detection pattern 16 made of silver paste, etc., is formed in an area enclosed by the two extending sections 12a, 12b of the antenna pattern 12 and the correction pattern 123 on the base sheet 11. The IC chip 13 incorporates a circuit which carries out a radio communication using the antenna pattern 12 of the loop antenna and detects a change of the peeling detection pattern 16 from a conductive state to non-conductive state (peeling detection).

Figure 9:
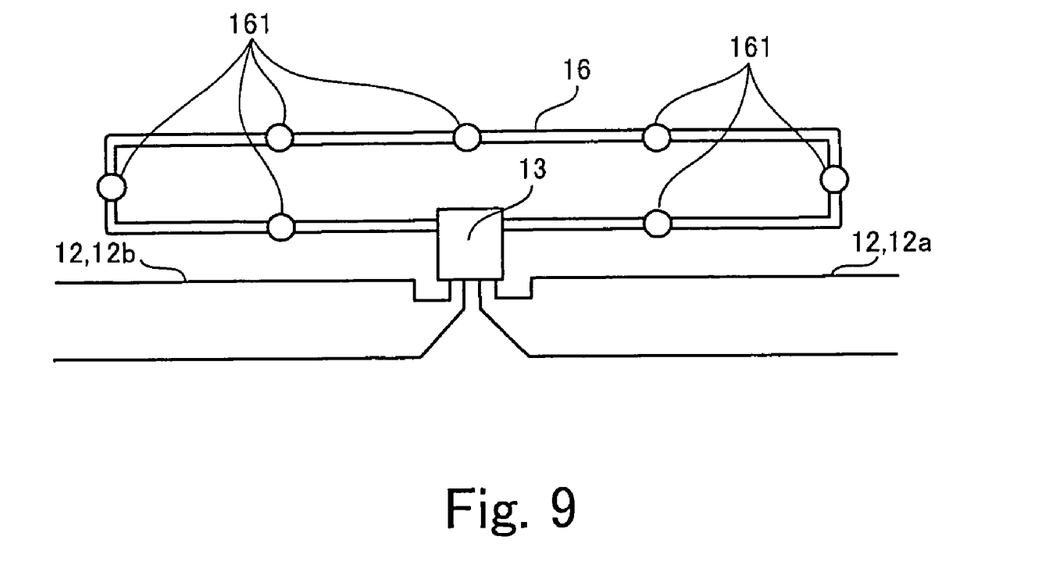
FIG. 9 is an enlarged view of the inside of a circle R in FIG. 8.

FIG. 9 is an enlarged view of the inside of the circle R in FIG. 8.

The ends of the antenna pattern 12 connected to the IC chip 13 are formed into a small width. This is intended to reduce the parasitic capacitance C produced in that part as much as possible.

Furthermore, the peeling detection pattern 16 is provided with peeling detection points 161 at several locations on the loop. These peeling detection points are strongly bonded to the cover sheet (not shown) as explained with reference to FIG. 5 to FIG. 7 and when this cover sheet is peeled, the peeling detection points 161 are peeled while remaining bonded to the cover sheet, which destroys the peeling detection pattern 16 and makes the peeling detection pattern 16 non-conducting and the IC chip 13 detects the peeling.

Since this peeling detection pattern 16 is formed within the area enclosed by the two extending sections 12a, 12b of the antenna pattern 12 and the correction pattern 123, it is possible to detect the peeling reliably without deteriorating the characteristic as the antenna of the antenna pattern 12.

As described above, the present invention is applicable regardless of the shape of the antenna pattern.

What is claimed is:

1. An RFID tag comprising:
   a base;
   a first conductive pattern provided on the base, which operates as a communication antenna;
   a second conductive pattern for peeling detection provided on the base, which is destroyed when peeled off the base;
   a circuit chip electrically connected to both the first conductive pattern and the second conductive pattern, which carries out a radio communication using the first conductive pattern as an antenna and detects the destruction of the second conductive pattern; and a cover covering the first conductive pattern, the second conductive pattern and the circuit chip, which is bonded to the base in a detachable manner and peeled off the base with the whole or part of the second conductive pattern remaining bonded, wherein the first conductive pattern includes two extending sections extending from the circuit chip, each end of which is connected to the circuit chip and a correction pattern for antenna characteristic correction which bypasses the circuit chip and connects the two extending sections, and the second conductive pattern is formed within an area enclosed by the two extending sections and the correction pattern.

2. The RFID tag according to claim 1, wherein the first conductive pattern comprises a pattern of a loop antenna, both ends of which are connected to the circuit chip.

3. The RFID tag according to claim 1, wherein the first conductive pattern comprises a pattern of a dipole antenna made up of two mono pole patterns, each end of which is connected to the circuit chip.

4. The RFID tag according to claim 1, wherein the correction pattern is an inductor which cancels out a parasitic capacitance produced between the circuit chip and the ends of the first conductive pattern connected to the circuit chip.

5. The RFID tag according to claim 1, wherein the second conductive pattern is a loop pattern, both ends of which are connected to the circuit chip, provided with peeling detection points at a plurality of locations on the loop of the second conductive pattern, which are peeled while remaining bonded to the cover when the cover is peeled off the base.

* * * * *